(12) United States Patent
Hirano

(10) Patent No.: US 7,977,649 B2
(45) Date of Patent: Jul. 12, 2011

(54) PLASMA ION SOURCE MASS SPECTROMETER

(75) Inventor: Kazushi Hirano, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 310 days.

(21) Appl. No.: 12/405,378

(22) Filed: Mar. 17, 2009

(65) Prior Publication Data

US 2009/0266984 A1   Oct. 29, 2009

(30) Foreign Application Priority Data

Apr. 25, 2008   (JP) .................. 2008-115529

(51) Int. Cl.
*H01J 49/00* (2006.01)
(52) U.S. Cl. ............. 250/396 R; 250/281; 250/288
(58) Field of Classification Search .......... 250/281, 250/282, 288, 396 R
See application file for complete search history.

(56) References Cited

U.S. PATENT DOCUMENTS

| | | | | |
|---|---|---|---|---|
| 4,481,415 A | * | 11/1984 | Takeda et al. | 250/292 |
| 5,481,107 A | * | 1/1996 | Takada et al. | 250/281 |
| 5,838,003 A | * | 11/1998 | Bertsch et al. | 250/288 |
| 6,031,379 A | * | 2/2000 | Takada et al. | 324/466 |
| 2010/0084549 A1 | * | 4/2010 | Ermakov et al. | 250/283 |

FOREIGN PATENT DOCUMENTS

| | | |
|---|---|---|
| JP | 61-107650 A1 | 5/1986 |
| JP | 8-7829 A1 | 1/1996 |
| JP | 10-97838 A1 | 4/1998 |
| JP | 2000-67805 A1 | 3/2000 |
| JP | 2000-100375 A1 | 4/2000 |
| JP | 2002-525821 A1 | 8/2002 |
| JP | 2004-71470 A1 | 3/2004 |
| JP | 2004071470 A * | 3/2004 |

* cited by examiner

*Primary Examiner* — Robert Kim
*Assistant Examiner* — Michael J Logie

(57) ABSTRACT

Provided is a plasma ion source mass spectrometer with an ion deflector lens having an improved removal ratio of photons and neutral particles as compared with the conventional art while an ion transmittance is maintained. The ion deflector includes an input side plate-like electrode, an output side plate-like electrode, and a tubular electrode disposed between the input side plate-like electrode and the output side plate-like electrode. The tubular electrode is of a point asymmetrical configuration. The tubular electrode is arranged so that a center axis of the tubular electrode is closer to an axis of travel of ions upstream of the input side plate-like electrode than an axis of travel of ions downstream of the output side plate-like electrode.

9 Claims, 7 Drawing Sheets

PLASMA ION SOURCE MASS SPECTROMETER

BACKGROUND OF THE INVENTION

1. Field of the Invention

The present invention relates to a mass spectrometer using plasma as anion source, and more particularly, to a mass spectrometer having an ion deflector lens.

2. Description of the Related Art

In a mass spectrometer using plasma as an ion source, such as an inductively coupled plasma mass spectrometer (ICP-MS) or a microwave plasma mass spectrometer (MIP-MS), it has been required that photons and neutral particles with high energy, which cause background noises, be separated from ion beams (for example, refer to JP 10-97838 A (FIG. 10), JP 2004-71470 A (FIG. 1), JP 8-7829 A (Paragraph [0009]), JP 2002-525821 A (FIG. 1), JP 61-107650 A (FIGS. 1 and 2), JP 2000-67805 A (FIG. 1), and JP 2000-100375 A (FIG. 2)).

Conventionally, photons and neutral particles which cause the background noises are separated from ion beams by an aid of a tilted or bent ion guide (for example, refer to JP 10-97838 A). Hereinafter, the tilted or bent ion guide is generally called "nonlinear ion guide." Photons and neutral particles are also separated from ion beams by an aid of a cylindrical ion deflector lens. The cylindrical ion deflector lenses are of a configuration symmetrical with respect to a point (for example, refer to JP 2004-71470 A) or of a configuration asymmetrical with respect to a point so as to provide an angle between before and after the ion deflector lens in an ion flying direction (for example, refer to JP 8-7829 A). Herein, the point asymmetrical means asymmetrical with respect to a point. Photons and neutral particles are also separated from ion beams by means of an ion mirror (for example, refer to JP 2002-525821 A and JP 2000-67805 A).

When the nonlinear ion guide is used for separation of photons and neutral particles, ion beams cannot be precipitously deflected by the nonlinear ion guide. Therefore, when an interval between an aperture arranged in front of the nonlinear ion guide and an aperture arranged at the other end of the ion guide is narrow, because the deviation quantity of ion beam becomes small, blocking of photons and neutral particles in the nonlinear ion guide is not sufficient. In addition, an input part and an output part of the tilted ion guide as well as a bent portion of the bent ion guide are low in the transmittance of ion.

Further, in the case of using an ion deflector lens for separation of photons and neutral particles, when the deviation quantity of ion beam is reduced, it is necessary to also reduce the diameter of the ion deflector lens. As a result, an aberration of the deflected ion beam is increased, and the transmittance of ions is reduced. Besides, the ion deflector lens that provides an angle between upstream and downstream of an ion flying direction is a factor for increasing the difficulty in the manufacture of the front and rear ion optical systems, and also a factor for increasing the size of a mass spectrometer.

Further, in the case of using an ion mirror for separation of photons and neutral particles, a deflector mechanism for the ion beam is complicated and large in size. Further, in order to set the transmittance of ion beam to a practical value, a plurality of electrode voltages are required to be adjusted.

SUMMARY OF THE INVENTION

In view of the above-mentioned circumstances, They are required (1) to provide a plasma ion source mass spectrometer with an ion deflector lens having an improved removal ratio of photons and neutral particles as compared with the conventional art while the ion transmittance is maintained, and (2) to downsize the ion deflector lens and the mass spectrometer.

In order to achieve the above-mentioned object, a mass spectrometer which uses plasma as an ion source, includes an ion deflector lens, in which the ion deflector lens includes: an input side plate-like electrode having one aperture; an output side plate-like electrode having one aperture; and at least one tubular electrode disposed between the input side plate-like electrode and the output side plate-like electrode, in which the input side plate-like electrode and the output side plate-like electrode face each other so that axes of the respective apertures are displaced from each other, and in which the tubular electrode is of a point asymmetric shape, and arranged so that a center axis of the tubular electrode is closer to an axis of travel of ions upstream of the input side plate-like electrode than an axis of travel of ions downstream of the output side plate-like electrode. It should be noted that the tubular electrode may have such a potential and configuration that the axis of travel of ions downstream of the output side plate-like electrode is substantially in parallel to the axis of travel of ions upstream of the input side plate-like electrode. Further, the tubular electrode may have a configuration in which a portion including at least a part of an input side end of the tubular electrode is removed from a complete cylinder. Further, the tubular electrode may have a configuration in which only the portion including the at least a part of an input side end of the tubular electrode is removed from the complete cylinder. Further, as a desirable configuration for the asymmetrical tubular electrode, there may be provided a configuration in which the complete cylinder is equally divided into four pieces by a virtual plane including the center axis of the complete cylinder and a virtual plane perpendicular to the center axis, and one of the four pieces, which is on an input side, is removed from the complete cylinder. It should be noted that the complete cylinder means a cylinder whose cross-sectional shapes taken along planes perpendicular to the central axis at any positions in the central axial direction of the cylinder are identical with each other.

The tubular electrode may be formed of a single cylindrical member or a plurality of cylindrical members. When the tubular electrode is formed of the plurality of cylindrical members, the cylindrical members may be formed by dividing the tubular electrode by planes perpendicular to the axis. Further, a cross section perpendicular to the axis of the tubular electrode may be circular, elliptical, or other line-symmetric shapes. The tubular electrode having a circular cross section is preferable from the viewpoint of ease of manufacture.

As the ion source, there may be provided ion sources such as inductively coupled plasma (ICP) or microwave induced plasma (MIP). In particular, high-frequency inductively coupled plasma, which is generated at atmospheric pressure, is preferable.

The ion deflector lens may be disposed upstream of a mass filtermass filter and downstream of another ion optical system having a negative potential. Alternatively, the ion deflector lens may be arranged immediately upstream of the mass filtermass filter.

According to the present invention, the tubular electrode of the ion deflector lens is of a point asymmetric shape, and the central axis of the tubular electrode is arranged closer to the axis of travel of ions upstream of the input side plate-like electrode than the axis of travel of ions downstream of the output side plate-like electrode. Therefore, the removal ratio of photons and neutral particles in the ion deflector lens becomes higher than that of the conventional art while the ion transmittance in the ion deflector lens is equal to or higher than that in the conventional art.

Further, according to the present invention, the ion deflector lens is arranged upstream of the mass filter, and also arranged downstream of the another ion optical system having a negative potential, or immediately upstream of the mass filter. As a result, the signal sensitivity of the mass spectrometer is increased, and the voltage adjustment for the another ion optical system is easily performed, as compared with the conventional art. This is because, in the ion optical system positioned upstream of the ion deflector lens, it is unnecessary to suppress the generation of neutral particles, and there is no limit of applied voltage of the ion optical system.

DETAILED DESCRIPTION OF THE PREFERRED EMBODIMENT

Figure 1:
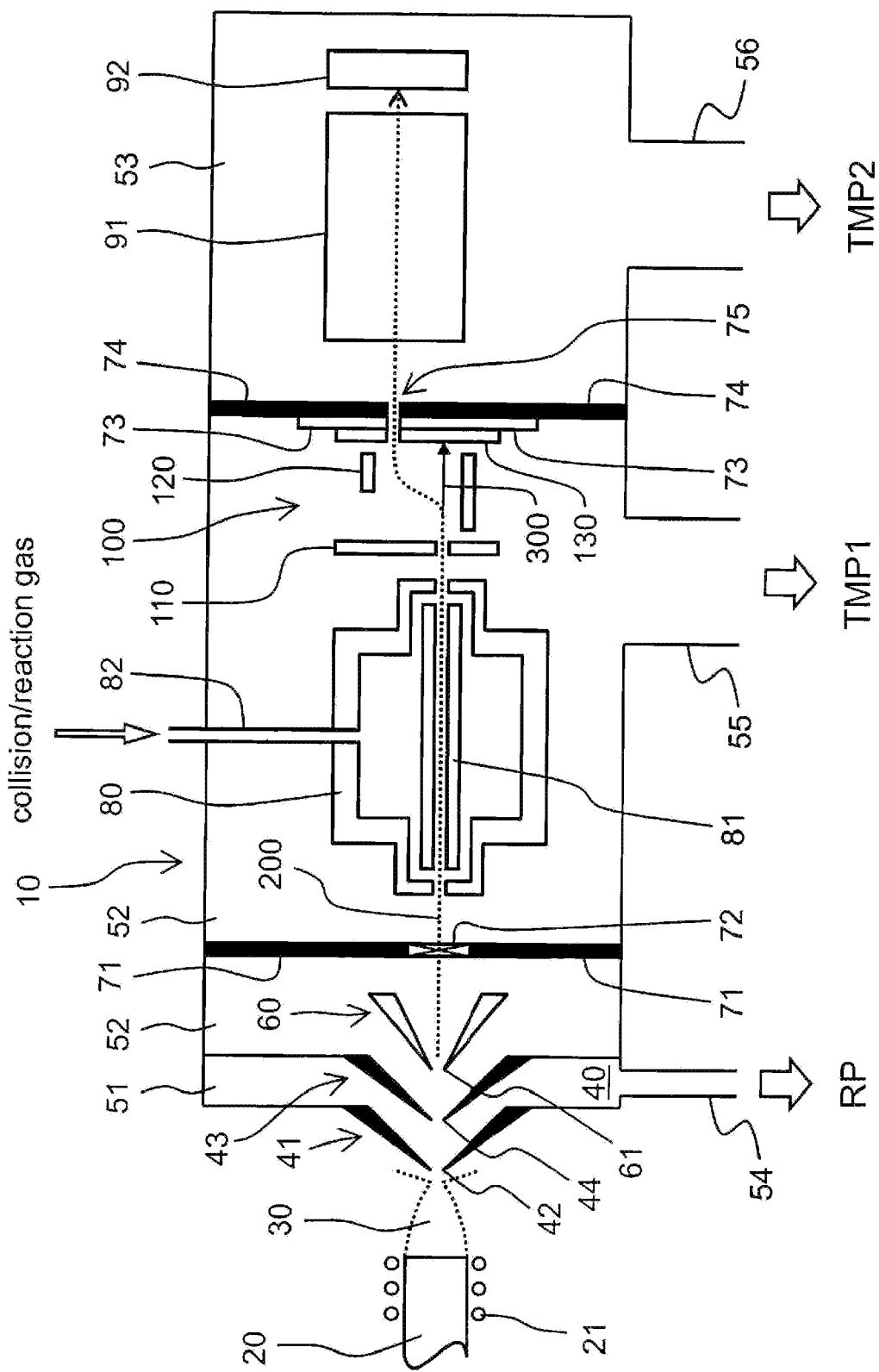
FIG. 1 is a diagram illustrating a configuration of an inductively coupled plasma mass spectrometer according to a first embodiment of the present invention.
Figure 2:
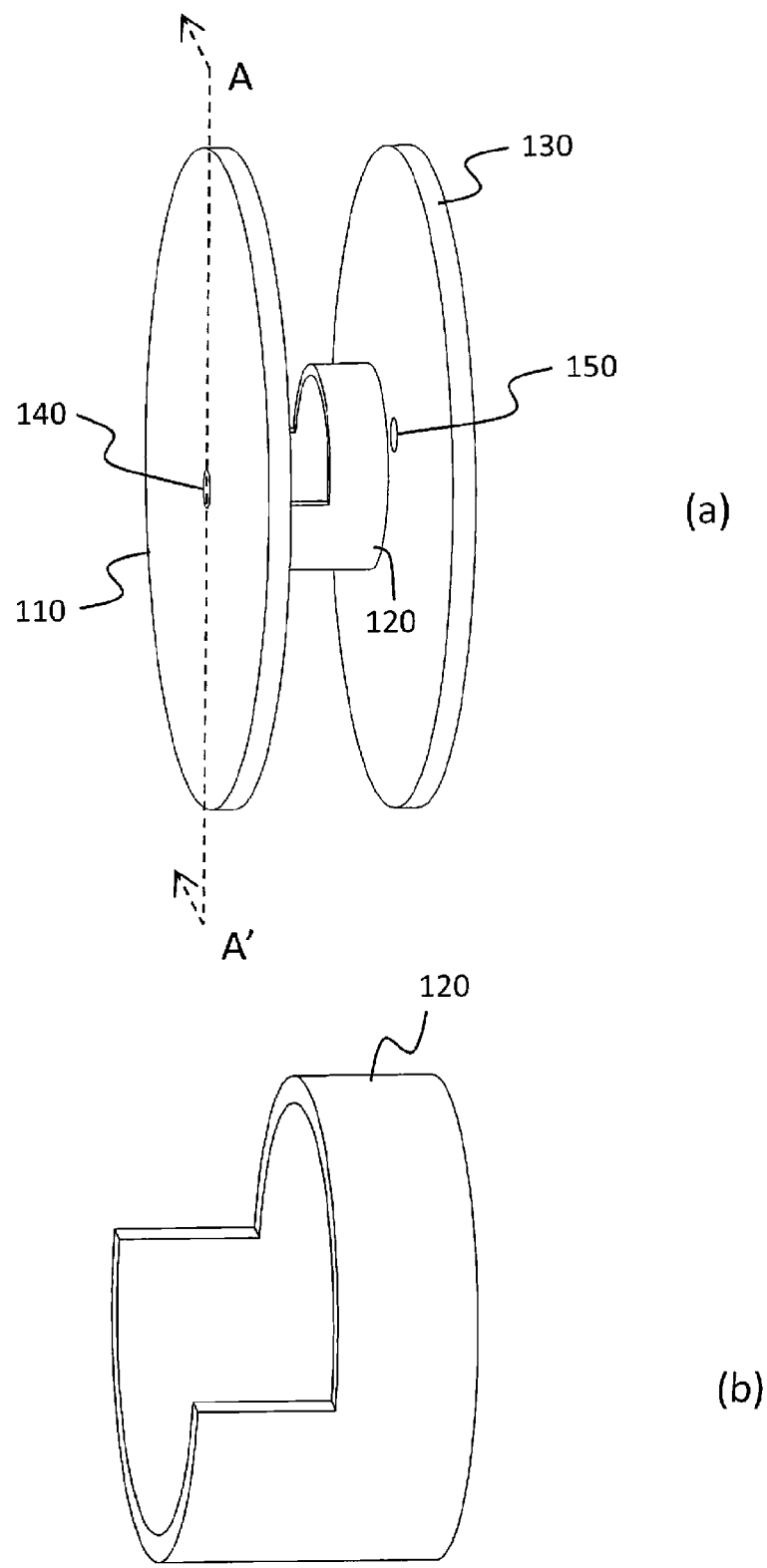
FIGS. 2A and 2B are perspective views illustrating a configuration of an ion deflector lens that is a characteristic portion of the first embodiment of the present invention.
Figure 3:
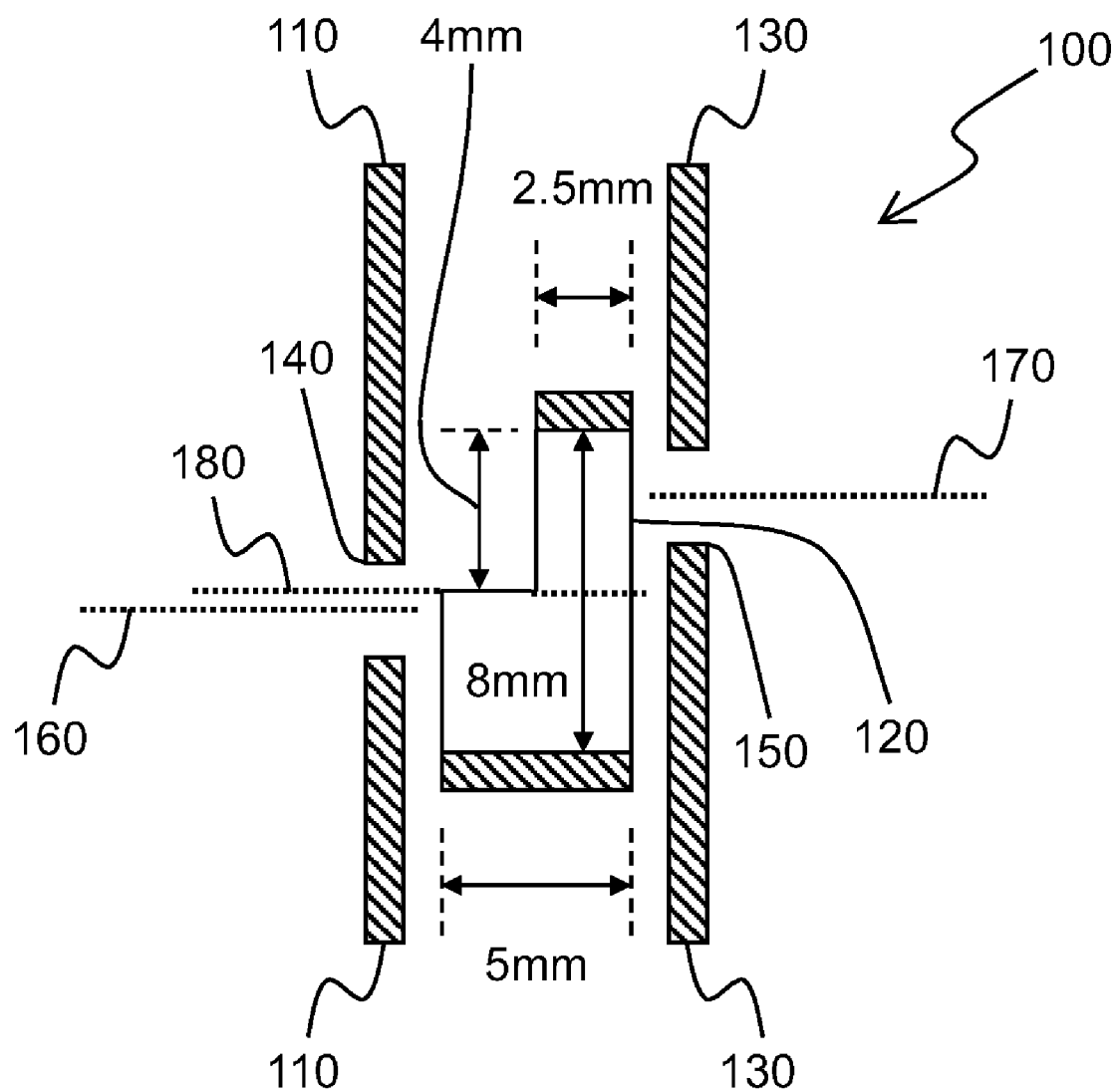
FIG. 3 is a cross-sectional view illustrating the configuration of the ion deflector lens.
Figure 4:
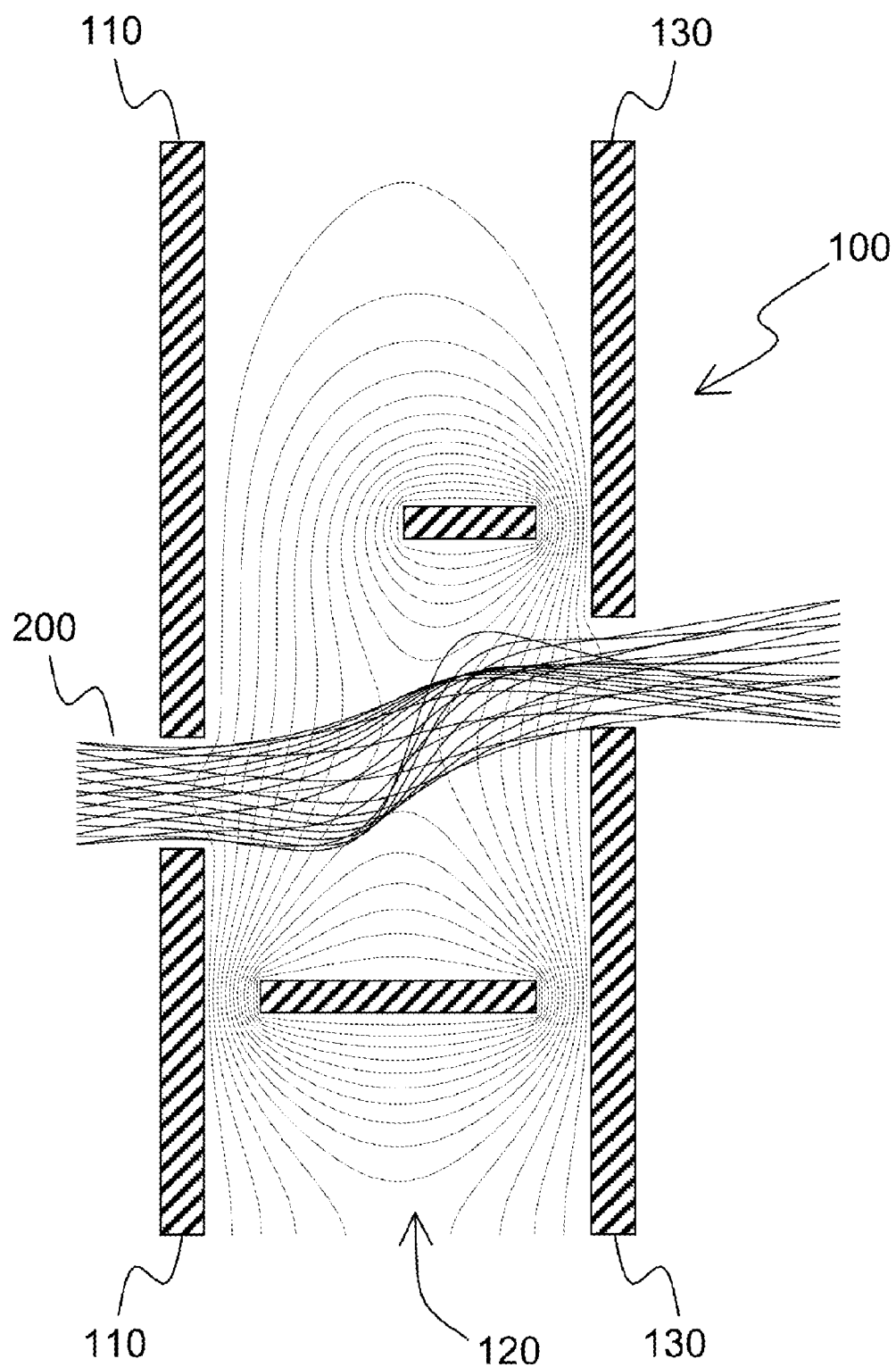
FIG. 4 is a diagram illustrating a potential distribution and an ion trajectory within the ion deflector lens.

Hereinafter, a description is given of a preferred embodiment of the present invention with reference to the accompanying drawings. In this example, FIGS. 1 to 4 are referred to. FIG. 1 is a diagram illustrating a partial schematic configuration of an inductively coupled plasma mass spectrometer according to a first embodiment of the present invention. Hereinafter, the inductively coupled plasma mass spectrometer is simply referred to as "mass spectrometer". Referring to FIG. 1, the configuration of the mass spectrometer 10 is illustrated in a cross-sectional view, but in actuality, the mass spectrometer 10 has a substantially tubular stereoscopic configuration which extends in the axial direction. FIGS. 2A and 2B are perspective views illustrating an ion deflector lens 100 which is a characteristic portion of the first embodiment. In FIGS. 2A and 2B, FIG. 2A is a view illustrating an entire ion deflector lens 100, and FIG. 2B is a view illustrating a part of the ion deflector lens 100. FIG. 3 is a cross-sectional view taken along a line A-A' of FIG. 2A. FIG. 4 is a diagram illustrating a result of simulating a potential distribution in the ion deflector lens 100 illustrated in FIG. 3, and orbits of ions that pass through the ion deflector lens 100.

First, the entirety of the mass spectrometer 10 is described. The mass spectrometer 10 includes a plasma torch 20, an interface unit 40, a extraction electrode unit 60, a cell 80, an ion deflector lens 100, a mass filter 91, and a detector 92.

The plasma torch 20 includes a coil 21 for generating a high frequency electromagnetic field in the vicinity of a leading end thereof, and is located under the atmospheric pressure. The coil 21 is connected to an RF power supply (not shown). Within the plasma torch 20, a high frequency inductively coupled plasma 30 is generated due to a high frequency electromagnetic field developed by the coil 21. Within the plasma torch 20, an atomized sample (not shown) is introduced into the plasma 30 from the front of the plasma torch 20. The introduced sample (not shown) is evaporated and decomposed by action of the plasma 30, and finally converted into ions in the case of the majority of elements. The ionized sample (not shown) is contained in the plasma 30. In addition, a gas stream occurs from a trailing end at left side toward a leading end at right side within the plasma torch 20, and thus the plasma 30 extends toward a sampling cone 41.

The interface unit 40 includes a sampling cone 41 and a skimmer cone 43. A part of the plasma 30 that has passed through an aperture 42 of the sampling cone 41 directly facing the plasma 30 reaches the skimmer cone 43 that is arranged downstream of the sampling cone 41. Thereafter, the part of the plasma 30 passes though an aperture 44 of the skimmer cone 43, and reaches the rear of the skimmer cone 43. A vacuum chamber 51 is exhausted by an oil-sealed rotary pump RP. Accordingly, gas molecules (containing neutralized ions) that do not pass through the skimmer cone 43 are exhausted from the vacuum chamber 51 through an outlet 54.

The extraction electrode unit 60 is applied with a negative potential, and therefore only positive ions are extracted in the form of an ion beam from the plasma 30 that has passed through the aperture 44 in the vicinity of an aperture 61 of the extraction electrode unit 60. The extraction electrode unit 60 is configured by one electrode in FIG. 1, but is not limited to this configuration. The extraction electrode unit 60 may be configured by two or more electrodes, for example, as described in JP 2001-185073 A.

An ion beam 200 extracted in the extraction electrode unit 60 is guided into the cell 80 through a gate valve 72 disposed in a partition 71. The gate valve 72 is disposed for maintaining airtightness of a high vacuum unit when the operation of the mass spectrometer 10 is stopped. The cell 80 is equipped with a multipole electrode 81. The ion beam 200 guided into the cell 80 is guided downstream along an orbit determined by an electric field generated by the multipole electrode 81. The multipole electrode 81 is, for example, of an eight-pole structure. Further, into the cell 80, a collision and/or reaction gas is introduced from an inlet 82. The molecules of introduced gas collide with various ions contained in the ion beam 200 or react with charge transfer, and act so as to decompose polyatomic interference ions containing argon atoms being a carrier gas or a plasma gas for desorption. The ion beam 200 extracted from the cell 80 is introduced into the mass filter 91 through the ion deflector lens 100 and an aperture 75 of a partition 74. The ion deflector lens 100 is fitted to the partition 74 through an insulator 73. The structural feature of the present invention resides in the ion deflector lens 100, and details thereof are described later. The vacuum chamber 52 is exhausted by a turbo molecule pump (TMP1). Accordingly, molecules resulting from neutralizing molecular ions contained in the plasma 30 by the extraction electrode unit 60, and molecules of collision and/or reaction gas which have been introduced into the cell 80 are exhausted from the vacuum chamber 52 through an outlet 55. The vacuum chamber 52 is higher in vacuum than the vacuum chamber 51.

The mass filter 91 is configured by a multipole electrode with a prefilter (not shown). The prefilter (not shown) and the multipole electrode (not shown) of the mass filter 91 are typically of a four-pole structure. Ions contained in the ion beam 200 which have been guided into the mass filter 91 are separated on the basis of a ratio of mass and charges (m/z value) in the mass filter 91, and then guided into the detector 92. The detector 92 detects the introduced ions, and outputs an electric signal according to the detection result. A vacuum chamber 53 is exhausted by a turbo molecule pump (TMP2) through the outlet 56. The vacuum chamber 53 is higher in vacuum than the vacuum chamber 52.

Next, the ion deflector lens 100 is described in detail. The ion deflector lens 100 is formed of a pair of plate-like electrodes 110 and 130, and one tubular electrode 120 disposed between the plate-like electrode 110 and the plate-like electrode 130. The input side plate-like electrode 110 has an aperture 140. The aperture 140 is of a circle 2 mm in diameter. An axis 160 of the aperture 140 passes through the center of the aperture 140, and is perpendicular to a plane of the plate-like electrode 110. In addition, the axis 160 is identical with an optical axis of the ion optical system upstream of the plate-like electrode 110, that is, an axis of travel of ions upstream of the plate-like electrode 110. The output side plate-like electrode 130 includes an aperture 150. The aperture 150 is substantially oval 1.5 mm in short axis and 2.4 mm in long axis. The direction of the long axis is identical with the longitudinal direction in FIG. 1. An axis 170 of the aperture 150 passes through the center of the aperture 150 and is perpendicular to the plane of the plate-like electrode 130. Further, the axis 170 is identical with an optical axis of the ion optical system downstream of the plate-like electrode 130, that is, the axis of travel of ions downstream of the plate-like electrode 130. The plate-like electrode 130 is arranged in parallel to the plate-like electrode 110 so that the axis 160 is displaced from the axis 170. The plate-like electrode 130 faces the plate-like electrode 110. A distance between the axis 160 and a center axis 180 is 0.6 mm, and a distance between the center axis 180 and the axis 170 is 1.9 mm. A distance between the axis 160 and the axis 170 is 2.5 mm. That is, the center axis 180, the axis 160, and the axis 170 of the tubular electrode 120 are contained on an identical virtual plane. The tubular electrode 120 is configured so that input-side one of four pieces into which the complete cylinder is equally divided by a virtual plane including the center axis of the complete cylinder and a virtual plane perpendicular to the center axis is removed from the complete cylinder. The inner diameter of the tubular electrode 120 is 8 mm, and the overall length of the tubular electrode 120 is 5 mm. Accordingly, a cut portion corresponds to a half cylinder of 2.5 mm in overall length and 8 mm in diameter. The plate-like electrode 110 and the plate-like electrode 130 are applied with a DC voltage of −30 V. The tubular electrode 120 is applied with a DC voltage of +15 V which is higher than the voltage that is applied to the plate-like electrode 110 and the plate-like electrode 130.

The path of ions guided into the ion deflector lens 100 is bent due to action of an electric field developed within the ion deflector lens 100, and the ions pass through the aperture 150. In this case, the axis of travel of ions downstream of the plate-like electrode 130 is substantially parallel to the axis of travel of ions upstream of the plate-like electrode 110. That is, ions downstream of the plate-like electrode 130 are advanced in a direction which the ions are capable of entering an ion optical system (mass filter 91 in this embodiment) having an optical axis parallel to the axis (optical axial direction of the multipole electrode 81 in this embodiment) of travel of ions upstream of the plate-like electrode 110, which is an ion optical system downstream of the plate-like electrode 130. The ions that have passed through the aperture 150 are separated by the mass filter 91, and detected by the detector 92. On the other hand, photons and neutral particles of high energy which have been guided into the ion deflector lens 100 together with the ions go straight as indicated by a solid line 300 of FIG. 1 without changing the path, and collide with the plate-like electrode 130, and stop.

As a result, photons and neutral particles may be prevented from entering the mass filter 91 and the detector 92, thereby eliminating background noise caused by the photons and the neutral particles. On the other hand, as is apparent from FIG. 4, most of ions input to the ion deflector lens 100 are output from the ion deflector lens 100, and the ion transmittance is kept equal to or higher than that of the conventional art.

The mass spectrometer 10 according to the first embodiment may be deformed as follows. For example, in the first embodiment, the axis 160 is apart from the center axis 180, but the axis 160 may be identical with the center axis 180. In addition, in the first embodiment, the cross section of the tubular electrode 120 is circular, but may be oval, rectangular, or have other line-symmetric shapes. In that case, the ion beam convergence property in two axial directions that are perpendicular to the cross section may be appropriately changed depending on the cross-section shape and the drive voltage. Further, in the first embodiment, the voltage applied to the plate-like electrode 110 and the voltage applied to the plate-like electrode 130 are identical with each other, which may be made different from each other. For example, it is possible that a DC voltage of −30 V is applied to the plate-like electrode 110, a DC voltage of −50 V is applied to the plate-like electrode 130, and a DC voltage of +10 V is applied to the tubular electrode 120.

Figure 5:
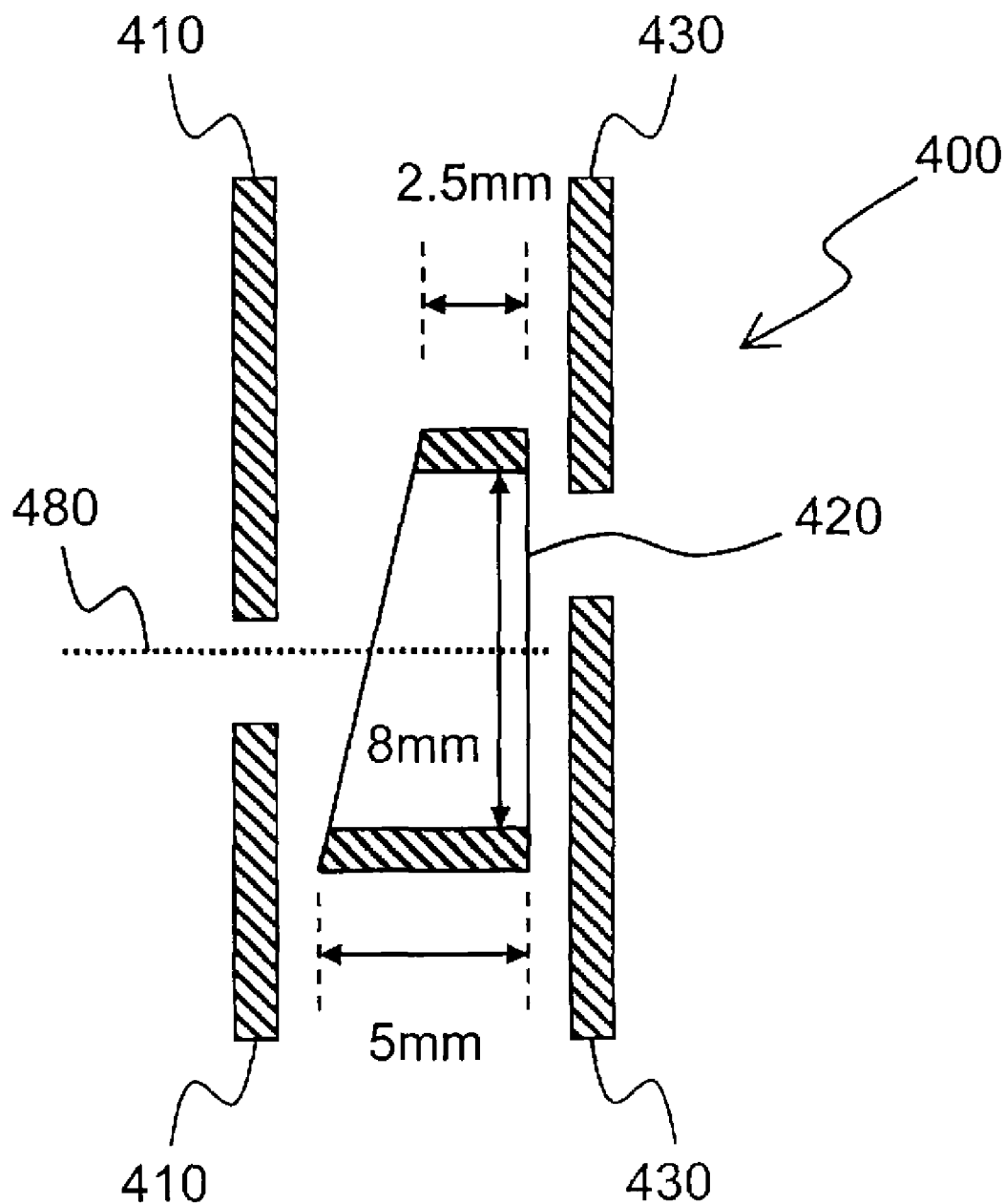
FIG. 5 is a cross-sectional view illustrating a configuration of an ion deflector lens according to a first modified example of the ion deflector lens.

Besides, in the first embodiment, the tubular electrode 120 is configured so that input-side one of four pieces into which the complete cylinder is equally divided by the virtual plane including the center axis of the complete cylinder and the virtual plane perpendicular to the center axis is removed from the complete cylinder. However, the tubular electrode 120 is not limited to the above-mentioned configuration. For example, the ion deflector lens 100 may be replaced with an ion deflector lens 400 illustrated in FIG. 5. The ion deflector lens 400 is formed of an input side plate-like electrode 410 having the same configuration as that of the plate-like electrode 110, an output side plate-like electrode 430 having the same configuration as that of the plate-like electrode 130, and a tubular electrode 420 disposed between the plate-like electrode 410 and the plate-like electrode 430. The plate-like electrode 410 and the plate-like electrode 430 face each other in parallel so that axes of the respective apertures thereof are displaced from each other. The tubular electrode 420 is of a cylindrical shape having an input side end cut by a virtual plane inclined with respect to a center axis 480. The tubular electrode 420 may be of a cylindrical shape having an output side end further cut by a virtual plane inclined with respect to the center axis 480.

Figure 6:
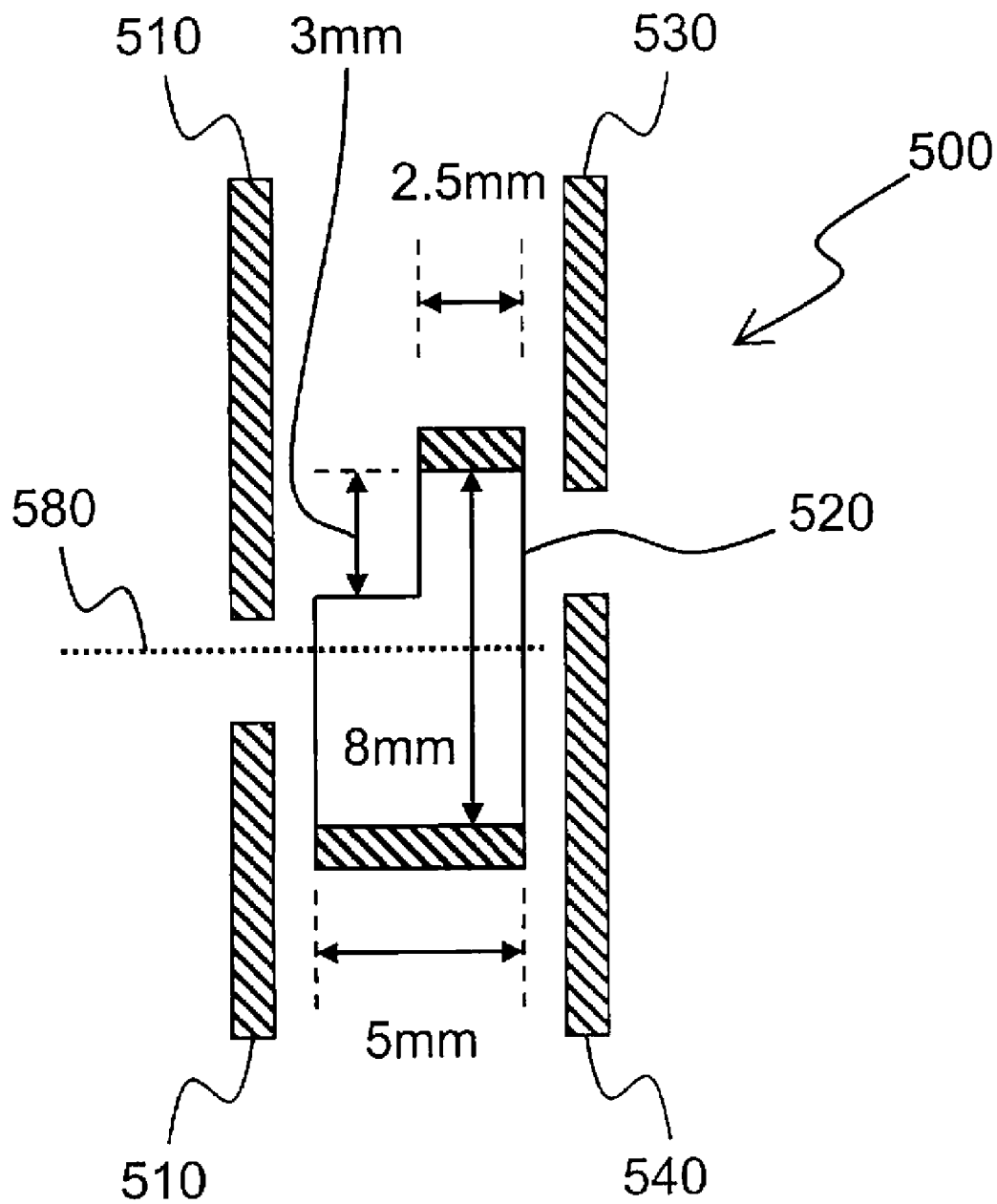
FIG. 6 is a cross-sectional view illustrating a configuration of an ion deflector lens according to a second modified example of the ion deflector lens.

Further, for example, the ion deflector lens 100 may be replaced with an ion deflector lens 500 illustrated in FIG. 6. The ion deflector lens 500 is formed of an input side plate-like electrode 510 having the same configuration as that of the plate-like electrode 110, an output side plate-like electrode 530 having the same configuration as that of the plate-like electrode 130, and a tubular electrode 520 disposed between the plate-like electrode 510 and the plate-like electrode 530. The plate-like electrodes 510 and 530 face each other in parallel so that axes of the respective apertures thereof are displaced from each other. The tubular electrode 520 is configured so that relatively small input-side one of four pieces into which the complete cylinder is equally divided by the virtual plane apart from the center axis 580 of the complete cylinder and parallel to the center axis 580, and the virtual plane perpendicular to the center axis 580 is removed from the complete cylinder.

Figure 7:
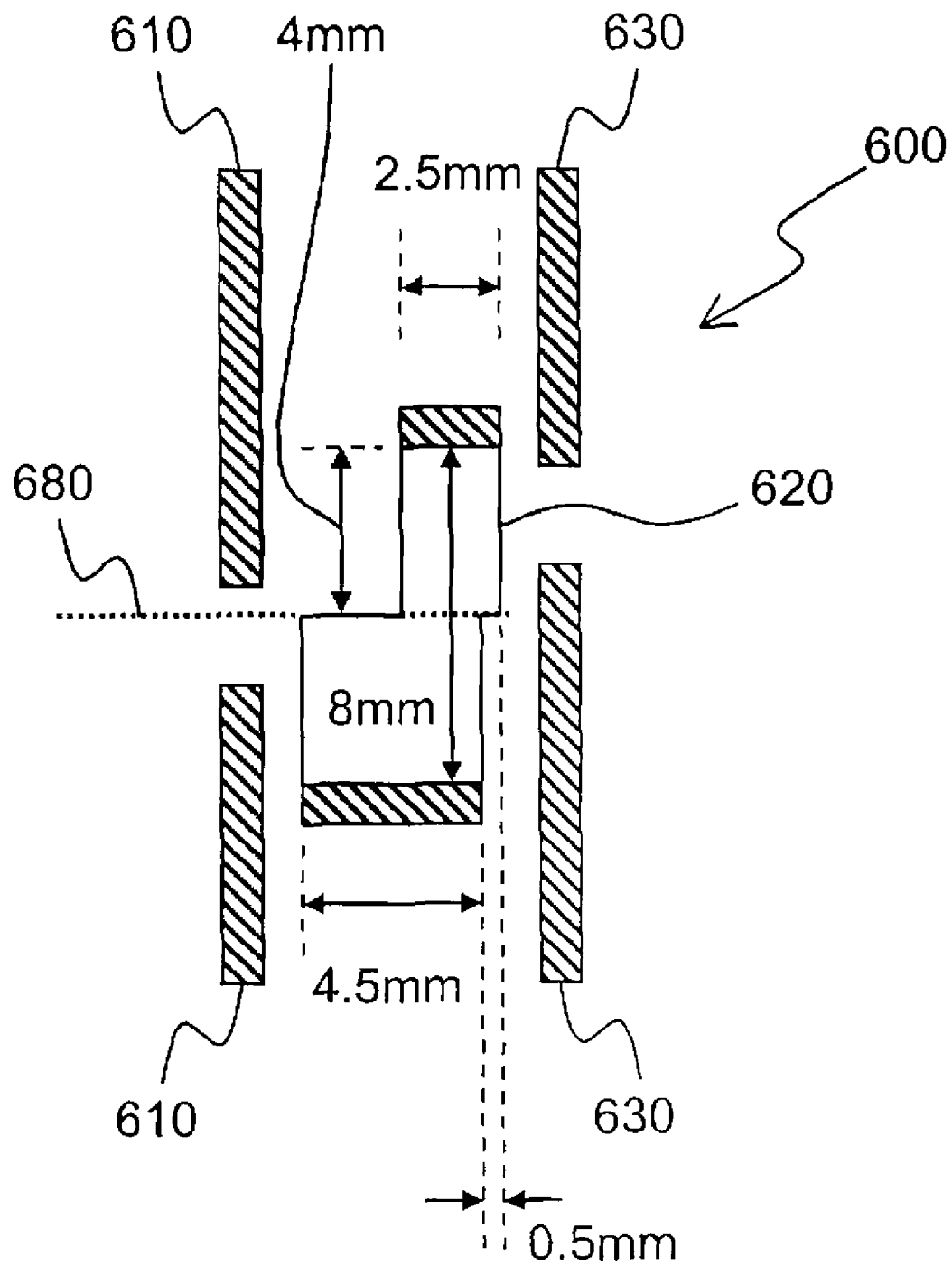
FIG. 7 is a cross-sectional view illustrating a configuration of an ion deflector lens according to a third modified example of the ion deflector lens.

Further, for example, the ion deflector lens 100 may be replaced with an ion deflector lens 600 illustrated in FIG. 7. The ion deflector lens 600 is formed of an input side plate-like electrode 610 having the same configuration as that of the plate-like electrode 110, an output side plate-like electrode 630 having the same configuration as that of the plate-like electrode 130, and a tubular electrode 620 disposed between the plate-like electrode 610 and the plate-like electrode 630. The plate-like electrodes 610 and 630 face each other in parallel so that axes of the respective apertures thereof are displaced from each other. The tubular electrode 620 is configured so that output-side one of four pieces into which the complete cylinder is equally divided by the virtual plane including the center axis 680 of the complete cylinder and the virtual plane perpendicular to the center axis 680 is removed from the tubular electrode 120. The portion cut on the input side is mainly located on a side different from that of the portion cut on the output side with respect to the virtual plane including the center axis 680 of the complete cylinder. The tubular electrode of the ion deflector lens according to the present invention may have a shape other than the above-mentioned shape.

Further, in the respective drawings, the ion beam is deflected upward in the ion deflector lens, but the deflection direction is not limited thereto. For example, the ion beam may be deflected downward. In this case, at least shapes of the tubular electrodes and locations of the apertures of the plate-like electrodes are reversed upside down. Naturally, the location of the ion optical system located upstream or downstream of the ion deflector lens will be changed. As described above, the shape of the tubular electrode and the like need to be appropriately changed in accordance with the defection direction of the ion beam, which may be easily performed by a person skilled in the art.

What is claimed is:

1. A mass spectrometer which uses plasma as an ion source, comprising an ion deflector lens,
   wherein the ion deflector lens comprises:
   an input side plate-like electrode having one aperture;
   an output side plate-like electrode having one aperture; and
   at least one tubular electrode disposed between the input side plate-like electrode and the output side plate-like electrode,
   wherein the input side plate-like electrode and the output side plate-like electrode face each other so that axes of the respective apertures are displaced from each other, and
   wherein the tubular electrode is of a point asymmetric shape, and arranged so that a center axis of the tubular electrode is closer to an axis of travel of ions upstream of the input side plate-like electrode than an axis of travel of ions downstream of the output side plate-like electrode.

2. A mass spectrometer according to claim 1, wherein the tubular electrode has such a potential and configuration that the axis of travel of ions downstream of the output side plate-like electrode is substantially in parallel to the axis of travel of ions upstream of the input side plate-like electrode.

3. A mass spectrometer according to claim 1, wherein the tubular electrode has a configuration in which a portion including at least a part of an input side end of the tubular electrode is removed from a complete cylinder.

4. A mass spectrometer according to claim 3, wherein the tubular electrode has a configuration in which only the portion including the at least a part of an input side end of the tubular electrode is removed from the complete cylinder.

5. A mass spectrometer according to claim 4, wherein the tubular electrode is configured so that input-side one of four pieces into which the complete cylinder is equally divided by a virtual plane including the center axis of the complete cylinder and a virtual plane perpendicular to the center axis is removed from the complete cylinder.

6. A mass spectrometer according to claim 1, wherein the tubular electrode is of a cylindrical configuration.

7. A mass spectrometer according to claim 1, wherein the ion deflector lens is arranged upstream of a mass filter, and arranged downstream of another ion optical system having a negative potential.

8. A mass spectrometer according to claim 7, wherein the ion deflector lens is arranged immediately upstream of the mass filter.

9. A mass spectrometer according to claim 1, wherein the plasma is a high frequency inductively coupled plasma.

* * * * *